United States Patent
Xiao

(10) Patent No.: US 9,501,989 B2
(45) Date of Patent: Nov. 22, 2016

(54) GATE DRIVER FOR NARROW BEZEL LCD

(71) Applicant: Shenzhen China Star Optoelectronics Technology Co., Ltd., Guangdong (CN)

(72) Inventor: Juncheng Xiao, Guangdong (CN)

(73) Assignee: Shenzhen China Star Optoelectronics Technology Co., Shenzhen (CN)

( * ) Notice: Subject to any disclaimer, the term of this patent is extended or adjusted under 35 U.S.C. 154(b) by 0 days.

(21) Appl. No.: 14/373,872

(22) PCT Filed: May 5, 2014

(86) PCT No.: PCT/CN2014/076783
§ 371 (c)(1),
(2) Date: Jul. 22, 2014

(87) PCT Pub. No.: WO2015/165124
PCT Pub. Date: Nov. 5, 2015

(65) Prior Publication Data
US 2015/0310819 A1 Oct. 29, 2015

(30) Foreign Application Priority Data
Apr. 29, 2014 (CN) .......................... 2014 1 0177821

(51) Int. Cl.
G06F 3/038 (2013.01)
G09G 3/36 (2006.01)
G11C 19/28 (2006.01)

(52) U.S. Cl.
CPC ............. *G09G 3/3674* (2013.01); *G11C 19/28* (2013.01); *G09G 2310/0286* (2013.01); *G09G 2310/0291* (2013.01); *G09G 2330/021* (2013.01)

(58) Field of Classification Search
CPC ............. G09G 3/3674; G09G 3/3677; G09G 2310/0291; G09G 2310/0286; G09G 2310/0267; G09G 3/36
See application file for complete search history.

(56) References Cited

U.S. PATENT DOCUMENTS 5,736,869 A * 4/1998 Wei .................. H03K 19/00315
326/81
2007/0035505 A1* 2/2007 Lin ...................... G09G 3/3648
345/100

(Continued)

FOREIGN PATENT DOCUMENTS

| CN | 101369460 | 2/2009 |
| CN | 101447232 | 6/2009 |
| CN | 103559867 | 2/2014 |
| CN | 103680453 | 3/2014 |

OTHER PUBLICATIONS

English abstract translation of CN103680453.

(Continued)

*Primary Examiner* — Kent Chang
*Assistant Examiner* — Mark Edwards
(74) *Attorney, Agent, or Firm* — WPAT, P.C., Intellectual Property Attorneys; Anthony King

(57) ABSTRACT

The present invention proposes a gate driver which simplifies a circuit structure by effectively compounding the pull-down holding circuit and signals to achieve a design for ultra-narrow bezel gate driver. In addition, It effectively lessens voltage offset at the second node and prolongs GOA circuit operating time to prolongs lifetime of the LCD when the seventh transistor of the first pull-down holding circuit adopts equivalent diode connection. At last, it reduces RC delay to efficiently lower power-consumption to more effectively decrease LCD energy-consumption when amount of transistors and signals of the first and the second pull-down holding circuits decreases.

8 Claims, 20 Drawing Sheets

(56) References Cited

U.S. PATENT DOCUMENTS

| | | | |
|---|---|---|---|
| 2012/0105397 A1* | 5/2012 | Tan | G09G 3/3677 345/205 |
| 2013/0335392 A1* | 12/2013 | Cho | H03K 3/00 345/211 |
| 2014/0103983 A1* | 4/2014 | Chang | G09G 3/3655 327/198 |
| 2015/0102990 A1 | 4/2015 | Kuo | |
| 2015/0279288 A1 | 10/2015 | Dai et al. | |

OTHER PUBLICATIONS

English abstract translation of CN101369460.
English abstract translation of CN101447232.
English abstract translation of CN103559867.

\* cited by examiner

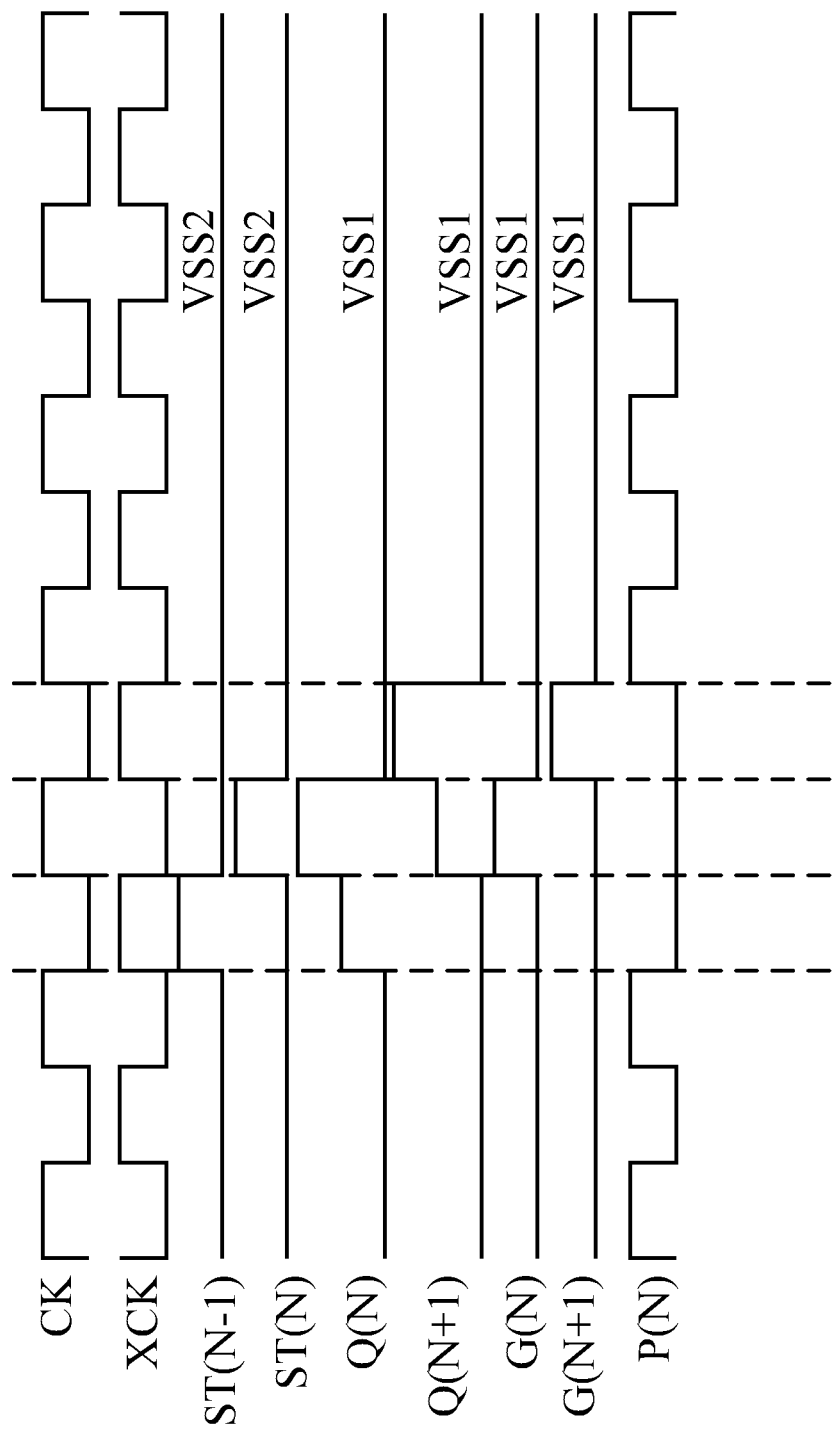

GATE DRIVER FOR NARROW BEZEL LCD

CROSS REFERENCE TO RELATED APPLICATION

The present application is based on, and claims priority from, Chinese application number 201410177821.2, filed Apr. 29, 2014, the disclosure of which is hereby incorporated by reference herein in its entirety.

BACKGROUND OF THE INVENTION

1. Field of the Invention

The present invention relates to a flat panel display field, more particularly, to a gate driver for a narrow bezel liquid crystal display (LCD).

2. Description of the Prior Art

It adopts Gate Driver On Array (GOA) circuit to arrange a gate driver in a thin film transistor (TFT) array substrate through a TFT-LCD array process to act a progressive scanning driving.

The GOA circuit mainly consists of a pull-up circuit, a pull-up control circuit, a transfer circuit, a pull-down circuit, a pull-down holding circuit and a boost circuit for boosting potentials.

The pull-up circuit mainly outputs input clock signals to the TFT gate as driving signals for an LCD. The pull-up control circuit is used for turning the pull-up circuit on by a signal from a previous one GOA circuit. The pull-down circuit is used for rapidly pulling down scan signals (i.e. potentials of a TFT gate) to low potentials after the scan signals are output. The pull-down control circuit is used for keeping the scan signals and pull-up circuit signals (i.e. the signals acting at Q point) off (i.e. set negative potentials), and generally there are two pull-down holding circuits working alternatively. The pull-up circuit is used for re-boosting potentials at Q point to assure an output end of the pull-up circuit output normally.

There are faults for conventional GOA circuit that too many TFTs and signal lines in a circuit for a disadvantage of a narrow or even none bezel display device and inevitably increasing RC effect to consume much energy to fail to meet a demand of green environment in the future.

SUMMARY OF THE INVENTION

An object of the present invention is to provide a gate driver with fewer TFTs to solve the problem.

According to the present invention, a gate driver comprises a plurality of cascaded connected shift register units, each shift register unit for outputting output signal pulses at an output end of each of the shift register units according to a first clock signal, a second clock signal and a driving signal pulse from a previous one shift register unit of each of the shift register units. Each shift register unit comprises: a pull-up circuit, comprising a first transistor whose a gate coupled to a first node, a source coupled to a first clock signal and a drain coupled to the output end, for providing the output signal pulses from the output end according to the first clock signal; a transfer circuit, comprising a second transistor whose a gate coupled to the first node, a source coupled to a first clock signal, and a drain coupled to a driving signal end, for outputting the driving signal pulse from the driving signal end according to the first clock signal; a pull-up control circuit, comprising a third transistor whose a source coupled to an output signal end of the previous one shift register unit, a gate coupled to a driving signal end of the previous one shift register end, a drain coupled to the first node, for conducting the pull-up circuit according to the driving signal pulses of the previous one shift register unit; a boost circuit, coupled between the first node and the output end, for boosting potentials of the first node; a first pull-down holding circuit, coupled to the first node, the first clock signal, a first constant voltage and a second constant voltage, for maintaining the first node at low voltage level; a second pull-down holding circuit, coupled to the first node, a driving signal end of the shift register unit after the next shift register unit, and the first constant voltage, for pulling down potentials of the first node according to driving signals of the shift register unit after the next shift register unit; and a pull-down circuit, coupled to the first constant voltage, the driving signal end and a driving signal end of a next one shift register unit, for pulling-down the potential of the first node to the first constant voltage.

In one aspect of the present invention, the first pull-down holding circuit comprises: a fourth transistor whose a gate and a source coupled to the first clock signal and a drain coupled to a second node; a fifth transistor whose a gate coupled to the driving signal end, a source coupled to the second node and a drain coupled to a second constant voltage; a sixth transistor whose a gate coupled to the driving signal end of the previous one shift register unit, a source coupled to the second node and a drain coupled to the second constant voltage; a seventh transistor whose a gate coupled to the second clock signal or the second node, a source coupled to the first clock signal and a drain coupled to the second node; an eighth transistor whose a gate coupled to the second node, a source coupled to the output end and a drain coupled to a first constant voltage; a ninth transistor whose a gate coupled to the second node, a source coupled to the first node and a drain coupled to the first constant voltage; and a tenth transistor whose a gate coupled to the second node, a source coupled to the driving signal end and a drain coupled to the second constant voltage.

In another aspect of the present invention, the second pull-down holding circuit comprises an eleventh transistor whose a gate coupled to the driving signal end of the shift register unit after the next shift register unit, a source coupled to the first node and a drain coupled to the first constant voltage.

In another aspect of the present invention, the second pull-down holding circuit further comprises a twelfth transistor whose a gate coupled to the driving signal end of the shift register unit after the next shift register unit, a source coupled to the output end and a drain coupled to the first constant voltage.

In another aspect of the present invention, the pull-down circuit comprises a thirteenth transistor whose a gate coupled to the driving signal end of the next one shift register unit, a source coupled to the driving signal end and a drain coupled to the second constant voltage.

In another aspect of the present invention, the pull-down circuit further comprises a fourteenth transistor whose a gate coupled to the driving signal end of the next one shift register unit, a source coupled to the output end and a drain coupled to the first constant voltage.

In another aspect of the present invention, the pull-down circuit further comprises a fifteenth transistor whose a gate coupled to the driving signal end of the next one shift register unit, a source coupled to the first node and a drain coupled to the first constant voltage.

In another aspect of the present invention, the pull-down circuit further comprises a fifteenth transistor whose a gate coupled to the driving signal end of the next one shift register unit, a source coupled to the first node, and a sixteenth transistor whose a gate and a source both coupled to the drain of the fifteenth transistor and a drain coupled to the first constant voltage.

In still another aspect of the present invention, the boost circuit is a capacitor.

In yet another aspect of the present invention, a magnitude of the first constant voltage is greater than that of the second constant voltage.

Compared with the prior art, the gate driver in the present invention simplifies a circuit structure by effectively compounding the pull-down holding circuit and signals to achieve a design for ultra-narrow bezel gate driver. In addition, It effectively lessens voltage offset at the second node P(N) and prolongs GOA circuit operating time to prolongs LCD life when the seventh transistor of the first pull-down holding circuit adopts equivalent diode connection. At last, it reduces RC delay to efficiently lower power-consumption to more effectively decrease LCD energy-consumption when amount of transistors and signals of the first and the second pull-down holding circuits decreases.

These and other features, aspects and advantages of the present disclosure will become understood with reference to the following description, appended claims and accompanying figures.

BRIEF DESCRIPTION OF THE DRAWINGS

FIG. 6B is timing diagram of input signals, output signals, and voltages applied on nodes illustrated in FIG. 6A.

DETAILED DESCRIPTION OF THE PREFERRED

In order to illustrate the technique and effects of the present invention, a detailed description will be disclosed by the following disclosure in conjunction with figures. It is noted that the same components are labeled by the same number.

Figure 1:
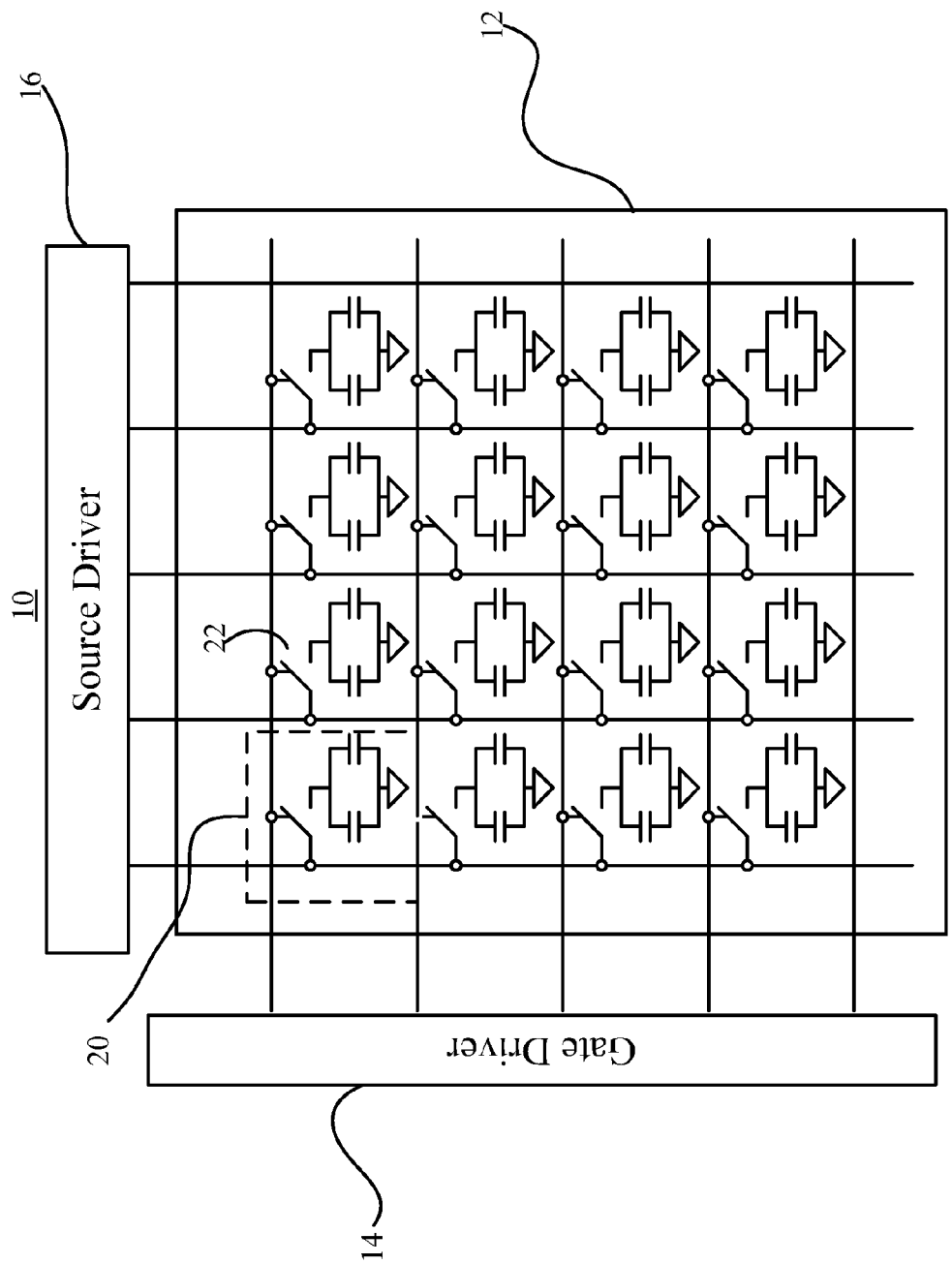
FIG. 1 is a functional block diagram of an LCD according to the present invention.

Please refer to FIG. 1, FIG. 1 is a schematic diagram of an LCD 10 according to the present invention. The LCD 10 comprises an LCD panel 12, a gate driver 14 and a source driver 16. The LCD panel 12 comprises a plurality of pixels, each pixel having three pixel units 20 indicating three primary colors, red, green, and blue. For example, the liquid crystal display 12 with 1024 by 768 pixels contains 1024× 768×3 pixel units 20. The gate driver 14 periodically outputs a scanning signal to turn on each transistor 22 of the pixel units 20 row by row, meanwhile, each pixel units 20 is charged to a corresponding voltage level based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row sequentially until all pixel units 20 of the LCD panel 12 finish charging, and the gate driver 14 outputs the scanning signal to the first row again and repeats the above-mentioned mechanism.

The gate driver 14 functions as a shift register. In other words, the gate driver 14 outputs a scanning signal to the LCD panel 12 at a fixed interval. For instance, a LCD panel 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 µs (i.e., 16.67 ms/768). The pixel units 20 are charged and discharged by data voltage from the source driver 16 to show corresponding gray levels in the time period of 21.7 µs accordingly.

Figure 2:
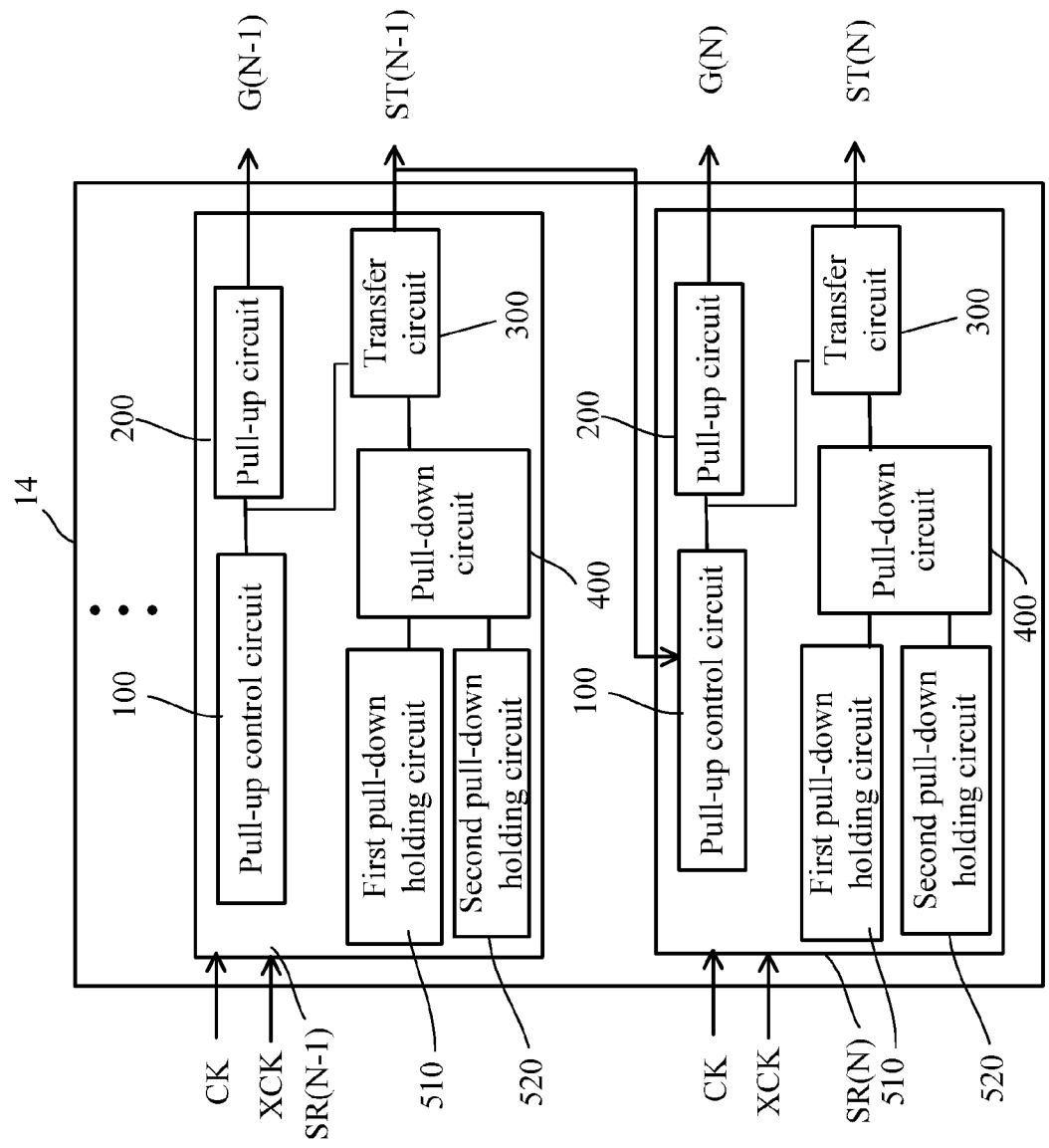
FIG. 2 is a functional block diagram of a shift register unit of the gate driver according to the present invention.

Please refer to FIG. 2, FIG. 2 is a functional block diagram of a shift register unit SR(N) of the gate driver 14 according to the present invention. The gate driver 14 comprises a plurality of cascade-connected shift register units SR(N), where N is 0 or a positive integer. The shift register unit SR(N) outputs a scan signal based on a first clock signal CK, a second clock signal XCK, and driving signal pulse from a previous one shift register unit SR(N−1). Upon being triggered by a start pulse at input end ST(0), the first shift register unit SR(1) delays the start pulse by a half cycle of the first clock signal CK (or the second clock signal XCK), and outputs the delayed pulse (i.e. output pulse) at an output end ST(1). Thereafter, each shift register unit SR(N) delays an input pulse from the output end ST(N−1) of the previous shift register unit SR(N) by a half cycle of the first clock signal CLK (or the second clock signal XCK), and outputs an output pulse at the output end ST(N). The output pulse is scanning signal to turn on the transistor of the pixel unit. A phase difference between the first clock signal CK and the second clock signal XCK is 180 degrees.

Each shift register unit SR(N) comprises a pull-up control circuit 100, a pull-up circuit 200, a transfer circuit 300, a pull-down circuit 400 and a pull-down holding circuit 500. The pull-down holding circuit 500 comprises a first pull-down holding circuit 510 and a second pull-down holding circuit 520.

Figure 3A:
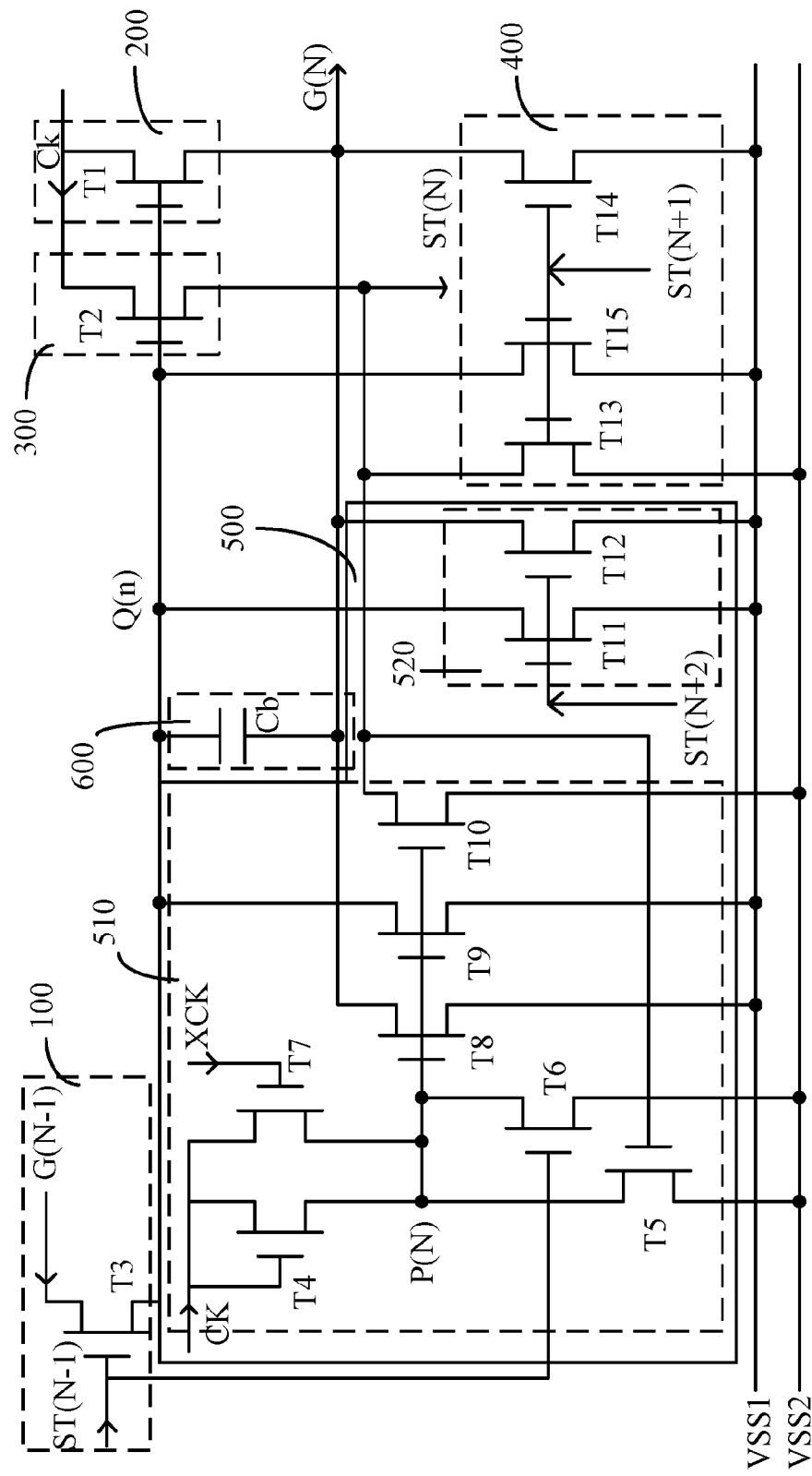
FIG. 3A is a circuit diagram of the shift register unit shown in FIG. 2 according to a first embodiment of the present invention.

Refer to FIG. 3A, FIG. 3A is a circuit diagram of the shift register unit SR(N) shown in FIG. 2 according to a first embodiment of the present invention. The pull-up circuit 200 may be a first transistor T1 whose a gate coupled to the first node Q(N), a source coupled to the first clock signal CK, a drain coupled to an output end G(N) for providing signal pulses to the output end G(N) based on the first clock signal CK. The transfer circuit 300 may be a second transistor T2 whose a gate coupled to the first node Q(N), a source coupled to the first clock signal CK, a drain coupled to a driving signal end ST(N) for providing driving signal pulses to the driving signal end ST(N) based on the first clock signal CK. The pull-up control circuit 100 is able to a third control circuit T3 whose a gate coupled to a driving signal end ST(N−1) of the previous one shift register unit SR(N−1), a drain coupled to the first node Q(N) for conducting the pull-up circuit 200 according to driving signal pulses of the previous one shift register unit SR(N−1). The boost circuit 600 may be a capacitor Cb coupled between the first node Q(N) and the output end G(N) for boosting potentials at the first node Q(N). The first pull-down holding circuit 510, coupled to the first node G(N), the first clock signal CK, the first constant voltage VSS1 and the second constant voltage VSS2, is used for maintaining the first node Q(N) at low voltage level. The second pull-down holding circuit 520, coupled to the first node Q(N), a driving signal end ST(N+2) of the next two shift register units SR(N+2) for each shift register unit, and the first constant voltage VSS1, pulls potentials of the first node Q(N) down according to the driving signals of the next two shift register units SR(N+2) for each shift register unit. The pull-down circuit 400, coupled to the first constant voltage VSS1, the driving signal end ST(N) and the driving signal end ST(n+1) of the next one shift register unit SR(n+1) for each shift register unit, pulls down potentials of the first node Q(N) to the first constant voltage VSS1. In the preferred embodiment, a magnitude of the first constant voltage VSS1 is greater than that of the second constant voltage VSS2.

The first pull-down holding circuit 510 comprises a fourth transistor T4, a fifth transistor T5, a sixth transistor T6, a seventh transistor T7, an eighth transistor T8, a ninth transistor T9 and a tenth transistor T10. A gate and a source of the fourth transistor T4 are both coupled to the first clock signal CK, and a drain of the fourth transistor T4 is coupled to a second node P(N), A gate, a source and a drain of the fifth transistor T5 are respectively coupled to the driving signal end ST(N), to the second node P(N) and to the second constant voltage VSS2. A gate, a source and a drain of the sixth transistor T6 are respectively coupled to the driving signal end ST(N−1) of the previous one shift register unit SR(N−1), to the second node P(N) and to the second constant voltage VSS2. A gate, a source and a drain of the seventh transistor T7 are respectively coupled to a second clock signal XCK, to the first clock signal CK and to the second node P(N). A gate, a source and a drain of the eighth transistor T8 are respectively coupled to the second node P(N), to the output end G(N) and to the first constant voltage VSS1. A gate, a source and a drain of the ninth transistor T9 are respectively coupled to the second node P(N), to the first node Q(N) and to the first constant voltage VSS1. A gate, a source and a drain of the tenth transistor T10 are respectively coupled to the second node P(N), to the driving signal end ST(N) and to the second constant voltage VSS2.

The second pull-down holding circuit 520 comprises an eleventh transistor T11 and a twelfth transistor T12. A gate, a source and a drain of the eleventh transistor T11 are respectively coupled to the driving signal end ST(N+2) of the next two shift register units SR(N+2) for each shift register unit, to the first node Q(N) and to the first constant voltage VSS1. A gate, a source and a drain of the twelfth transistor T12 are respectively coupled to the driving signal end ST(N+2) of the next two shift register units SR(N+2) for each shift register unit, to the output end G(N) and to the first constant voltage VSS1.

The pull-down circuit 400 comprises a thirteenth transistor T13, a fourteenth transistor T14 and a fifteenth transistor T15. A gate, a source and a drain of the thirteenth transistor T13 are respectively coupled to the driving signal end ST(n+1) of the next one shift register unit SR(n+1) for each shift register unit, to the driving signal end ST(N) and to the second constant voltage VSS2. A gate, a source and a drain of the fourteenth transistor T14 are respectively coupled to the driving signal end ST(n+1) of the next one shift register units SR(n+1) for each shift register unit, to the output end G(N) and to the first constant voltage VSS1. A gate, a source and a drain of the fifteenth transistor T15 are respectively coupled to the driving signal end ST(n+1) of the next one shift register units SR(n+1) for each shift register unit, to the first node Q(N) and to the first constant voltage VSS1.

Figure 3B:
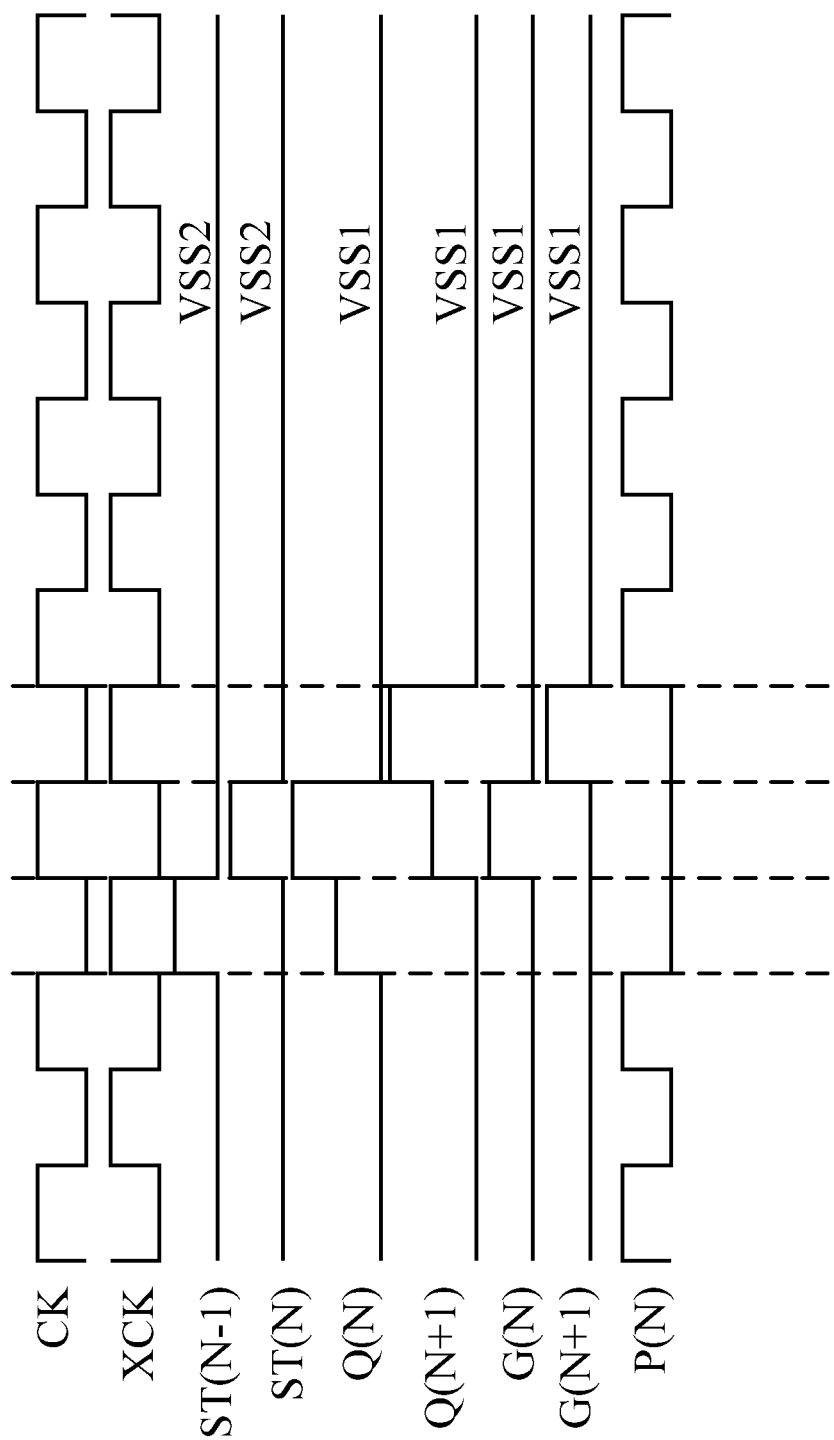
FIG. 3B is timing diagram of input signals, output signals, and voltages applied on nodes illustrated in FIG. 3A.

Please refer to FIG. 3A and FIG. 3B in conjunction. FIG. 3B is timing diagram of input signals, output signals, and voltages applied on nodes illustrated in FIG. 3A. The eighth transistor T8 is used for maintaining the output end G(N) at low voltage level, and the ninth transistor T9 is used for maintaining the first node Q(N) at low voltage level. The fifth transistor T5 pulls the potential of the second node P(N) down when the driving signal end ST(N) is at high voltage level. The sixth transistor T6 pulls the potential of the second node P(N) down when the driving signal end ST(N−1) is at high voltage level, and therefore, the pull-down holding circuit 510 in working is turned off to prevent from output effects of the first node Q(N) and the output end G(N). An object that a potential of the second constant voltage VSS2 is lower than which of the first constant voltage VSS1 is to lower potentials of the second node P(N) through two stage partial pressure principle. In hence, the lower of the potential of the second node P(N) in working is, the eighth transistor T8 and the ninth transistor T9 are more effectively turned off to disconnect for preventing the output end G(N) from discharging abnormally. The eleventh transistor T12 and the eleventh transistor T11 are respectively pulled down potentials of the first node Q(N) and the output end G(N) in the next period to assure that potentials of the first node Q(N) and the output end G(N) be pulled down rapidly after the output end G(N) outputs.

It is introduced in FIG. 3B that the potential of the output end G(N) is pulled down at the same level of the first constant voltage VSS1, and the potential of the second node P(N) is pulled down lower than the second constant voltage VSS2 when the first node Q(N) and the output G(N) are at high voltage level. Therefore, the gate-source voltage of the eighth transistor T8 and the ninth transistor T9 is Vgs=VSS2−VSS1<0 so that it effectively lowers leakage current from the eighth transistor T8 and the ninth transistor T9.

Figure 4A:
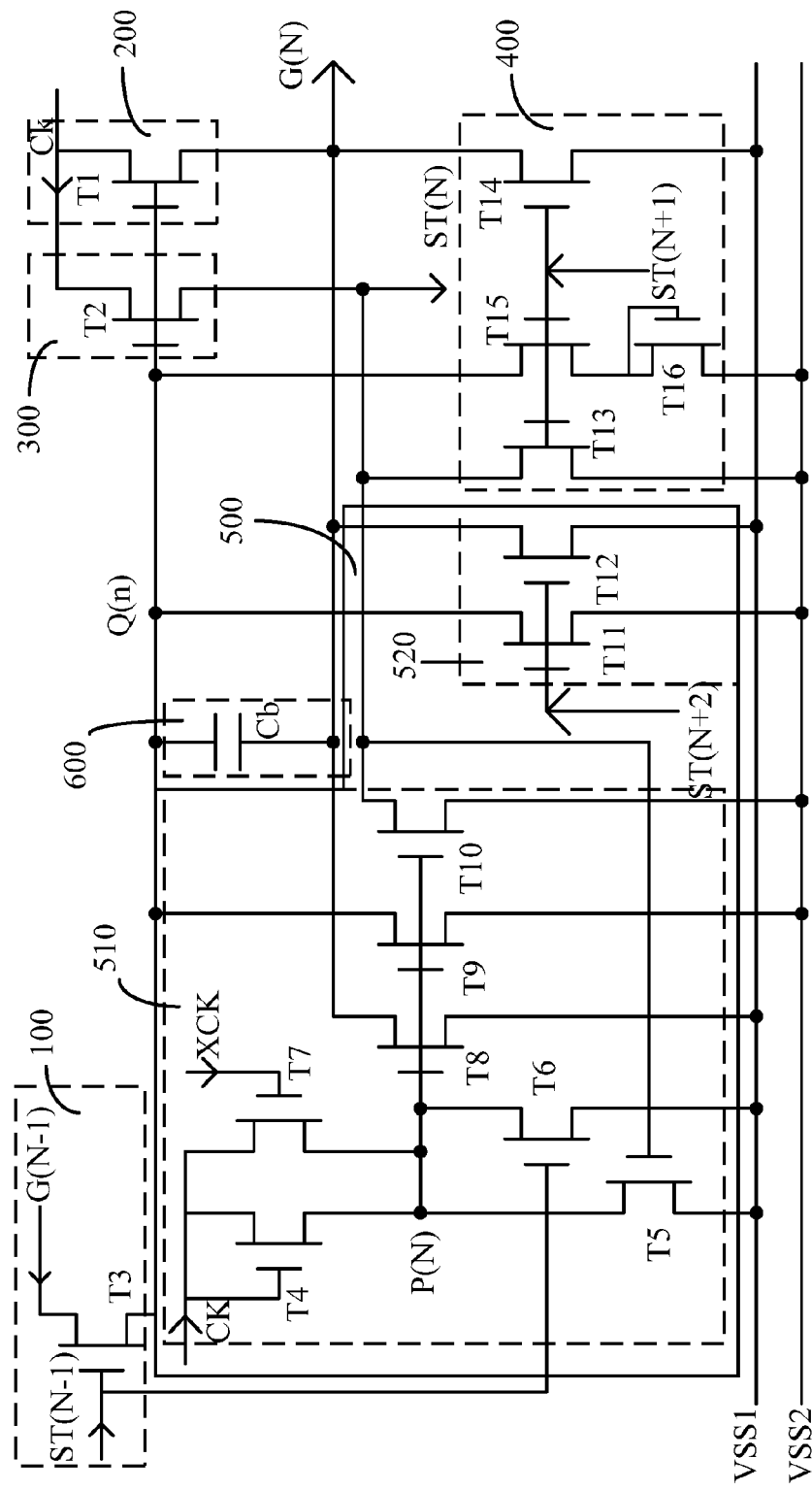
FIG. 4A is a circuit diagram of the shift register unit shown in FIG. 2 according to a second embodiment of the present invention.
Figure 4B:
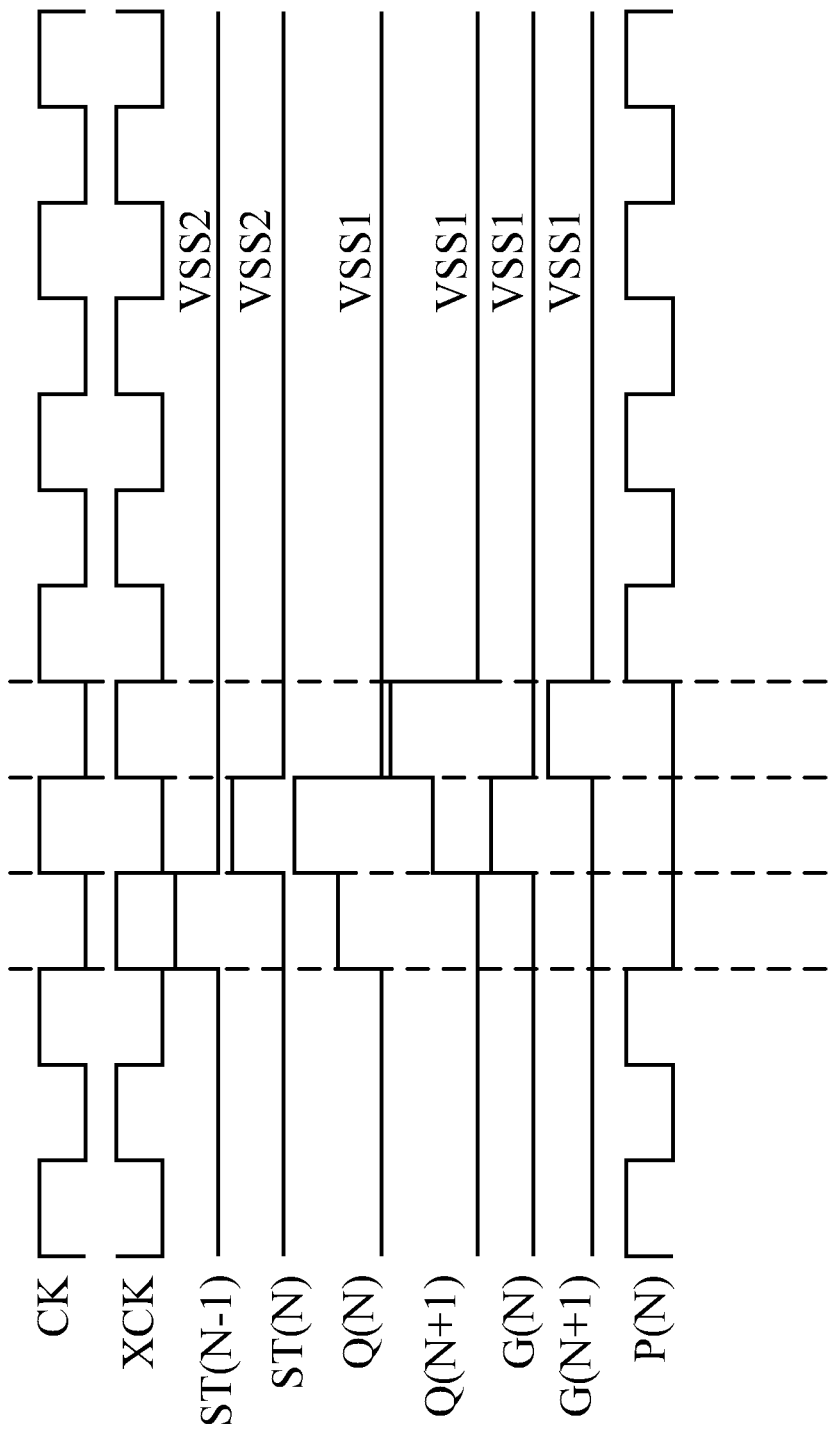
FIG. 4B is timing diagram of input signals, output signals, and voltages applied on nodes illustrated in FIG. 4A.

Please refer to FIG. 4A and FIG. 4B. FIG. 4A is a circuit diagram of the shift register unit shown in FIG. 2 according to a second embodiment of the present invention. FIG. 4B is timing diagram of input signals, output signals, and voltages applied on nodes illustrated in FIG. 4A. The elements of the shift register unit SR(N) in FIG. 4A have the same labeled number with those of the shift register unit SR(N) in FIG. 3A have the identical operating principles, and no further description is demonstrated. A difference between the FIG. 4A and FIG. 3A is that the pull-down circuit 400 further comprises a sixteenth transistor T16, and the connections of the fifteenth transistor T15 and the sixteenth transistor T16 are not identical. A gate and a source of the fifteenth transistor T15 are respectively coupled to the driving signal end ST(n+1) of the next one shift register unit SR(n+1) for each shift register unit and to the first node Q(N). A gate and a source of the sixteenth transistor T16 are both coupled to the drain of the fifteenth transistor T15, and the drain of the sixteenth transistor T16 is coupled to the first constant voltage VSS1. The operation principle and achieving effect of the shift register unit SR(N) in FIG. 4A is identical to which of the shift register unit SR(N) in FIG. 3A, there is no further description accordingly.

Figure 5A:
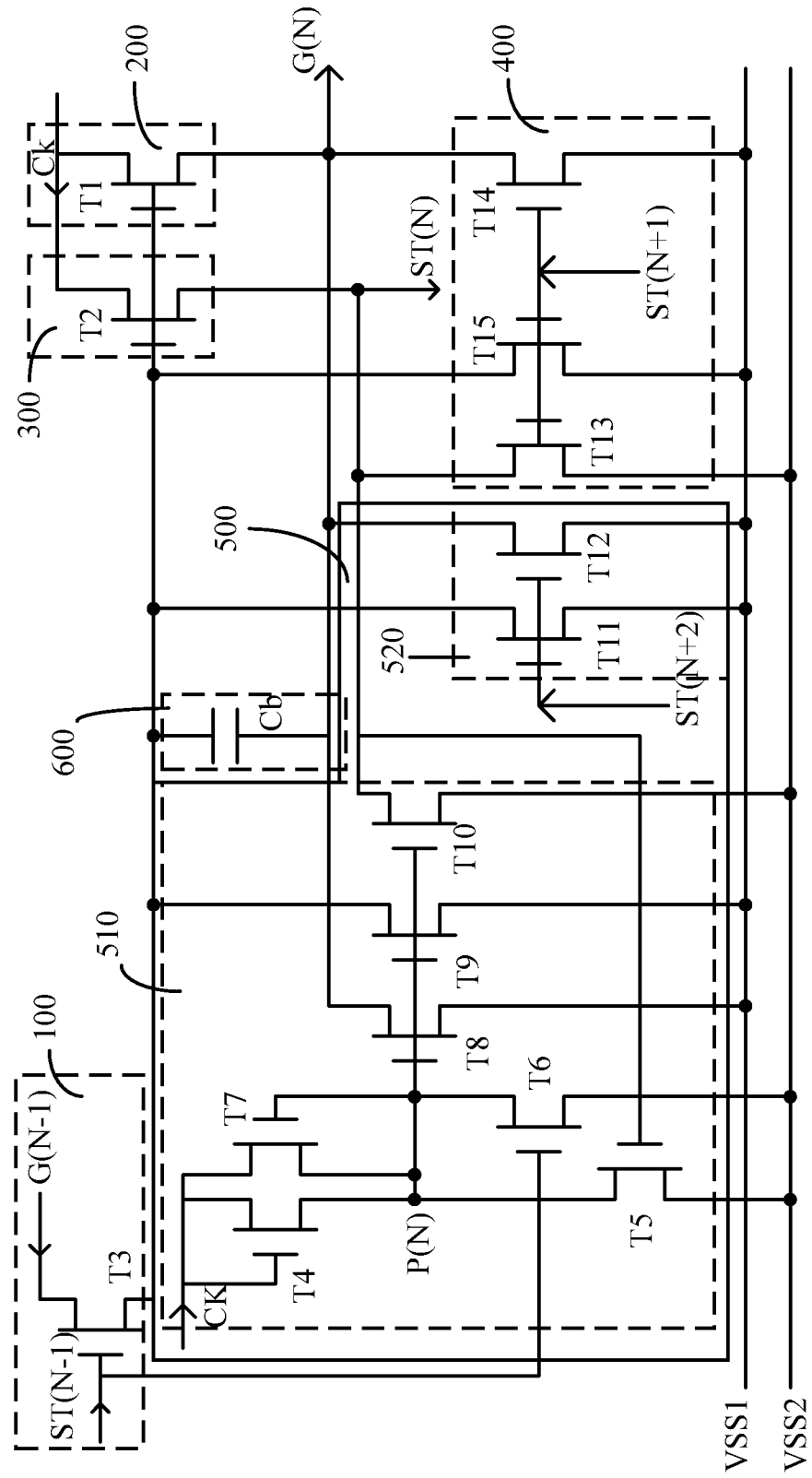
FIG. 5A is a circuit diagram of the shift register unit shown in FIG. 2 according to a third embodiment of the present invention.
Figure 5B:
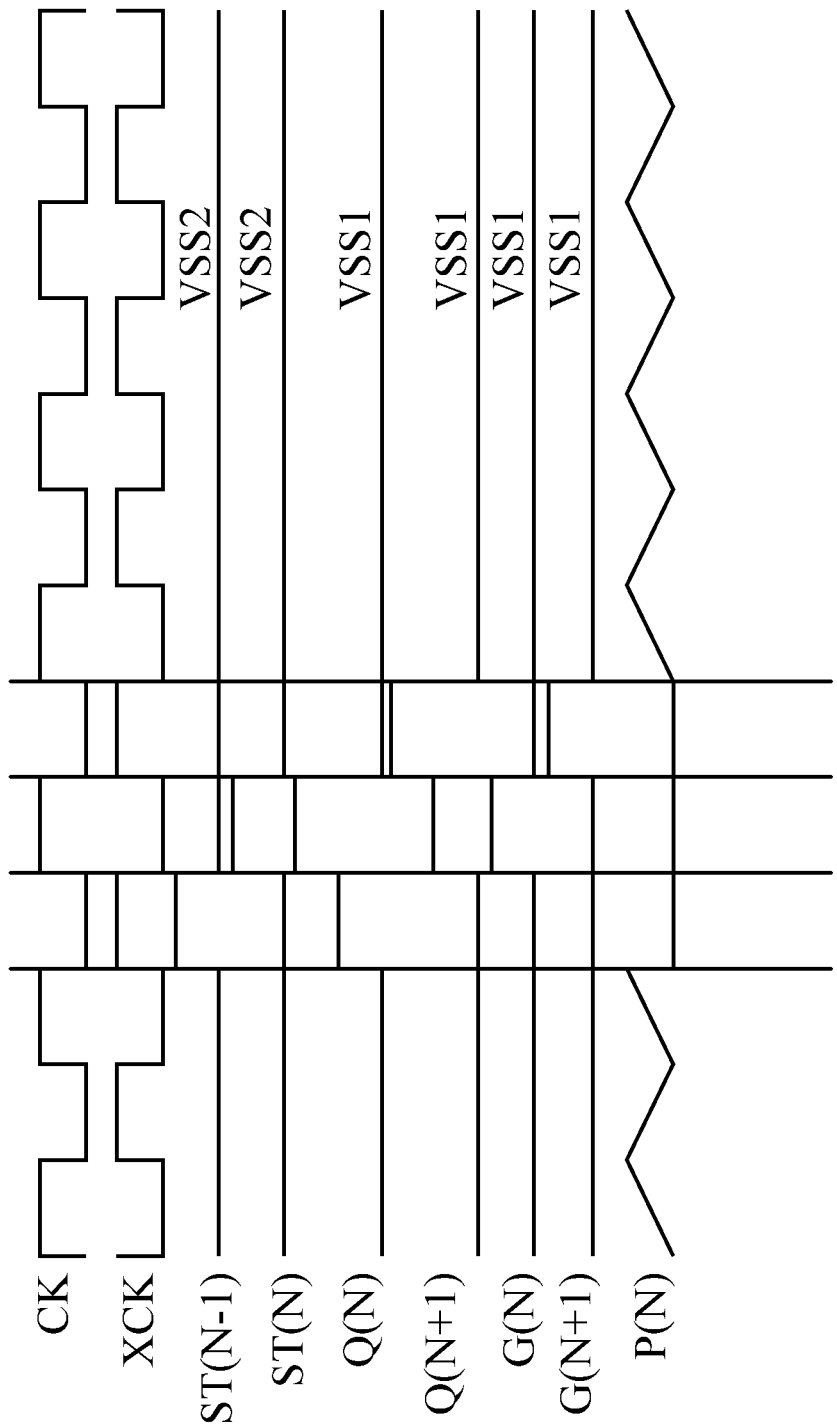
FIG. 5B is timing diagram of input signals, output signals, and voltages applied on nodes illustrated in FIG. 5A.

Please refer to FIG. 5A and FIG. 5B. FIG. 5A is a circuit diagram of the shift register unit shown in FIG. 2 according to a third embodiment of the present invention. FIG. 5B is timing diagram of input signals, output signals, and voltages applied on nodes illustrated in FIG. 5A. The elements of the shift register unit SR(N) in FIG. 5A have the same labeled number with those of the shift register unit SR(N) in FIG. 3A have the identical operating principles, and no further description is demonstrated. A difference between FIG. 5A and FIG. 3A is that the gate of the seventh transistor T7 of the first pull-down holding circuit 510 is coupled to the second node P(N) so that it reduces cross line crosstalk between the first clock signal CK and the second clock signal XCK. Compared with FIG. 3B, the second node P(N) discharges more effectively according to waveform of the seventh transistor T7. The operation principle and achieving effect of the shift register unit SR(N) in FIG. 5A is identical to which of the shift register unit SR(N) in FIG. 3A, there is no further description accordingly.

Figure 6A:
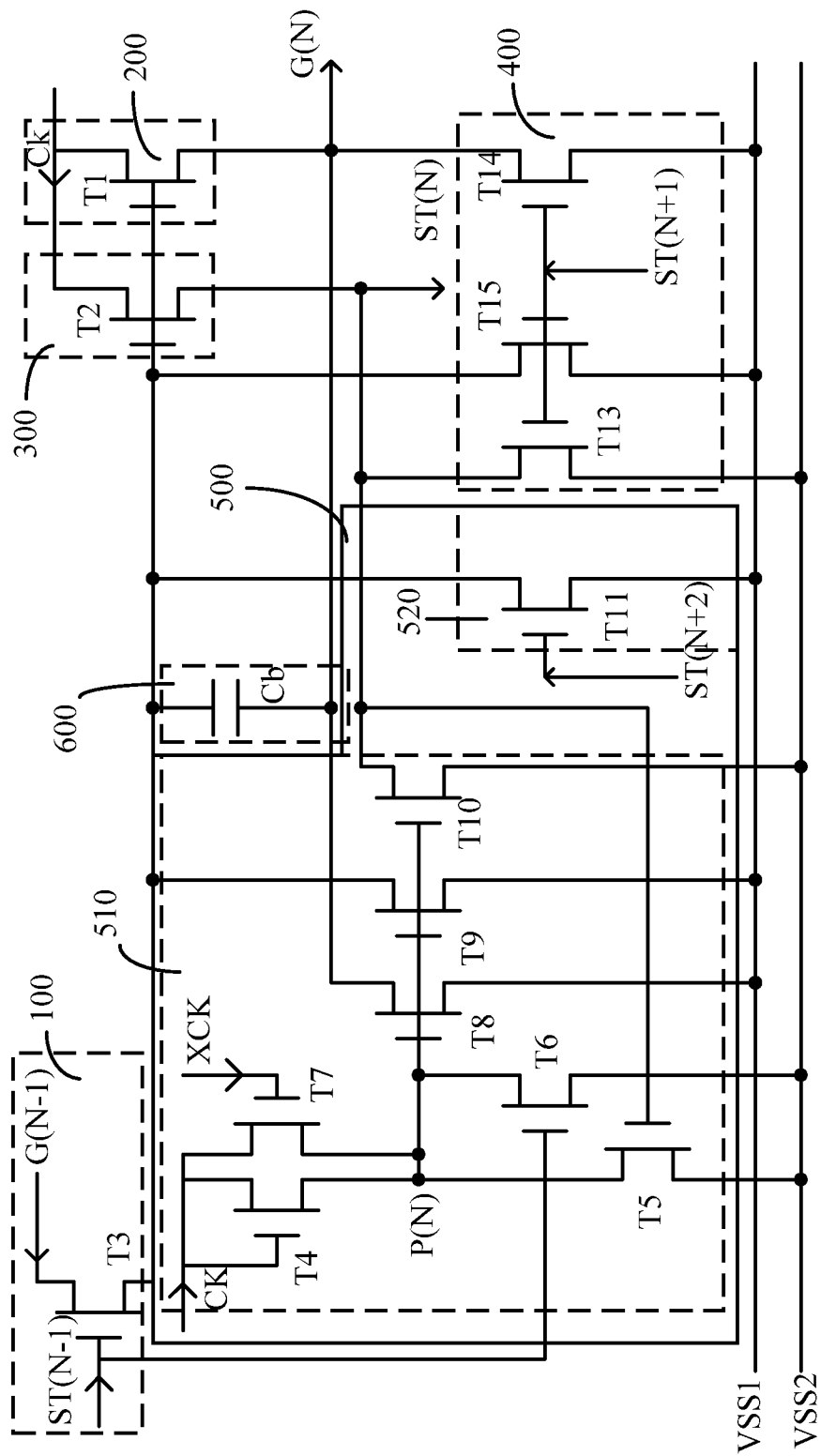
FIG. 6A is a circuit diagram of the shift register unit shown in FIG. 2 according to a fourth embodiment of the present invention.

Refer to FIG. 6A and FIG. 6B. FIG. 6A is a circuit diagram of the shift register unit shown in FIG. 2 according to a fourth embodiment of the present invention. FIG. 6B is timing diagram of input signals, output signals, and voltages applied on nodes illustrated in FIG. 6A. The elements of the shift register unit SR(N) in FIG. 6A have the same labeled number with those of the shift register unit SR(N) in FIG. 3A have the identical operating principles, and no further description is demonstrated. A difference between FIG. 6A and FIG. 3A is that the second pull-down holding circuit 520 in FIG. 6A has no twelfth transistor T12 to decrease for shortening RC delay. The operation principle and achieving effect of the shift register unit SR(N) in FIG. 6A is identical to which of the shift register unit SR(N) in FIG. 3A, there is no further description accordingly.

Figure 7A:
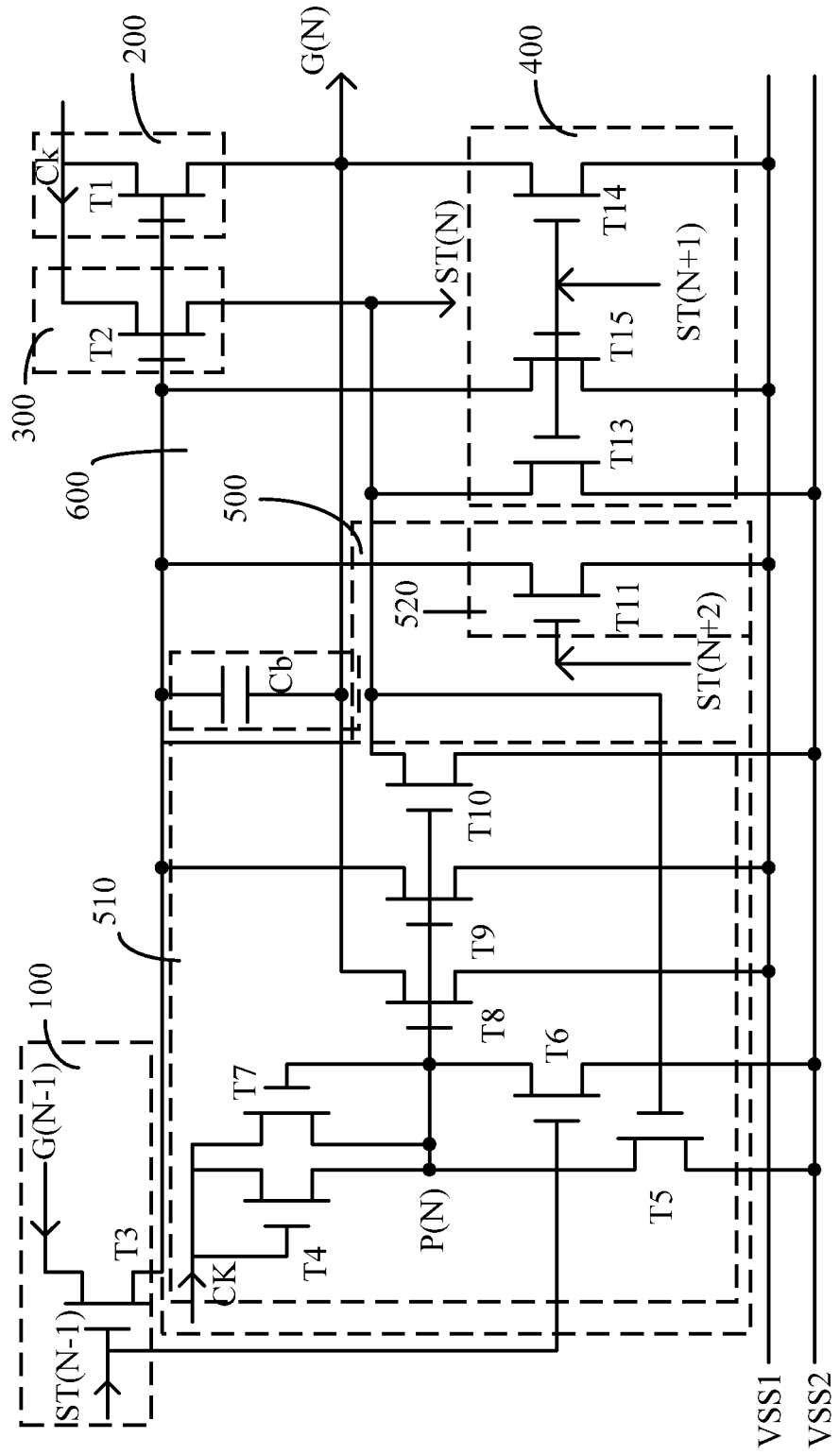
FIG. 7A is a circuit diagram of the shift register unit shown in FIG. 2 according to a fifth embodiment of the present invention.
Figure 7B:
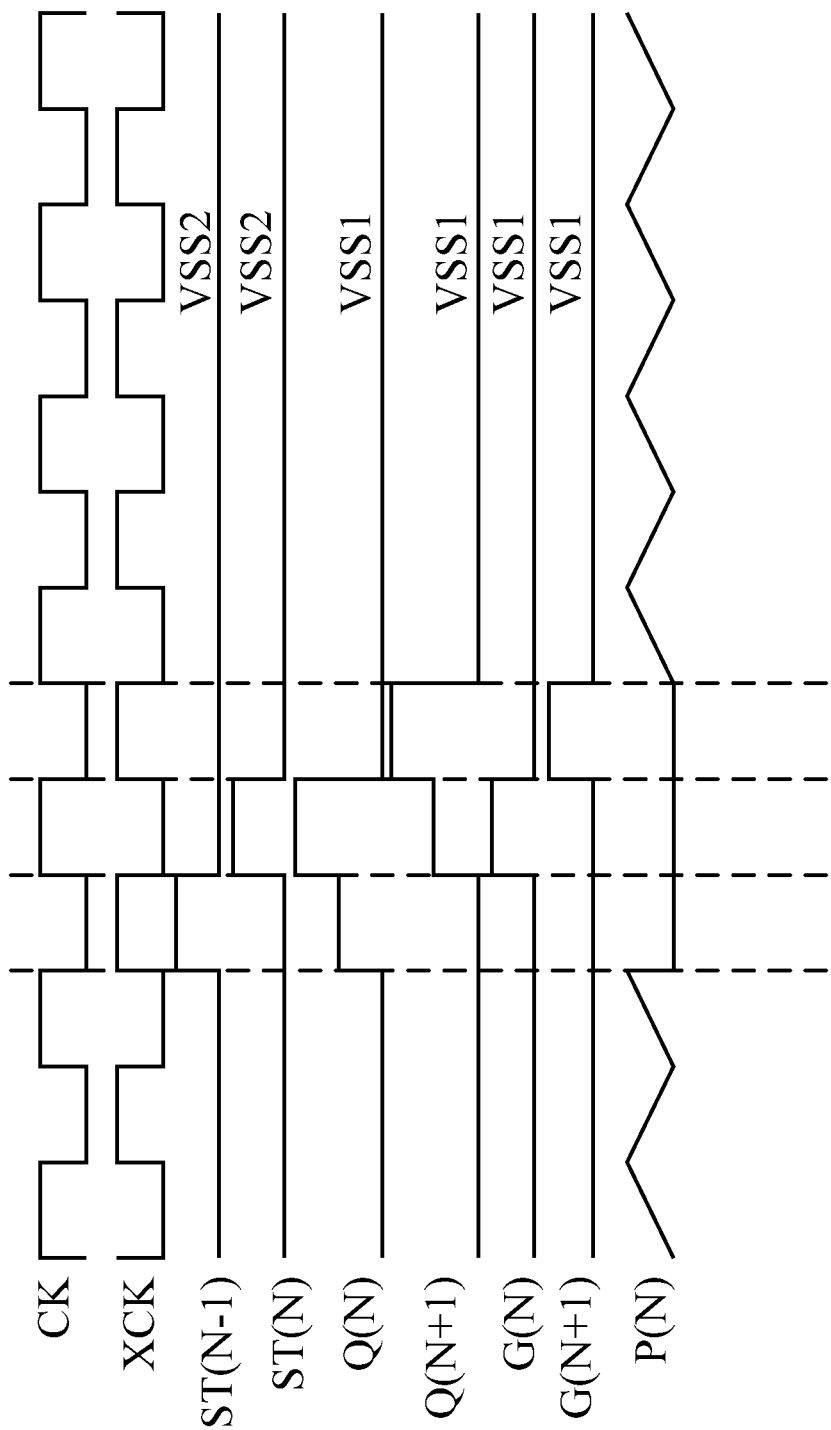
FIG. 7B is timing diagram of input signals, output signals, and voltages applied on nodes illustrated in FIG. 7A.

Refer to FIG. 7A and FIG. 7B. FIG. 7A is a circuit diagram of the shift register unit shown in FIG. 2 according to a fifth embodiment of the present invention. FIG. 7B is timing diagram of input signals, output signals, and voltages applied on nodes illustrated in FIG. 7A. The elements of the shift register unit SR(N) in FIG. 7A have the same labeled number with those of the shift register unit SR(N) in FIG. 6A have the identical operating principles, and no further description is demonstrated. A difference between FIG. 7A and FIG. 6A is that the gate of the seventh transistor T7 of the first pull-down holding circuit 510 is coupled to the second node P(N) so that it reduces cross line crosstalk between the first clock signal CK and the second clock signal XCK. Compared with FIG. 6B, the second node P(N) in FIG. 7A more effectively discharges according to the waveform of the seventh transistor T7. The operation principle and achieving effect of the shift register unit SR(N) in FIG. 7A is identical to which of the shift register unit SR(N) in FIG. 6A, there is no further description accordingly.

Figure 8A:
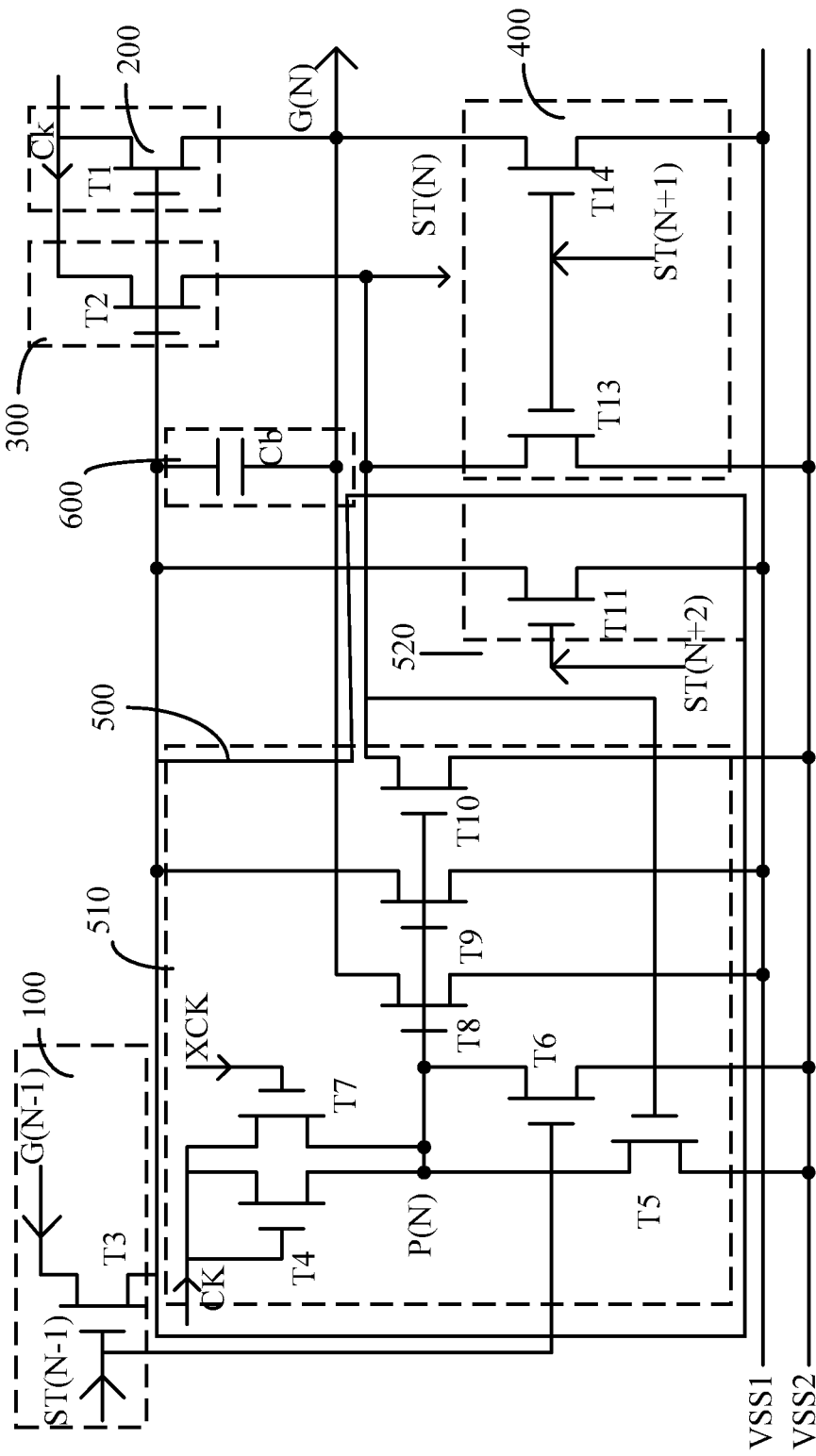
FIG. 8A is a circuit diagram of the shift register unit shown in FIG. 2 according to a sixth embodiment of the present invention.
Figure 8B:
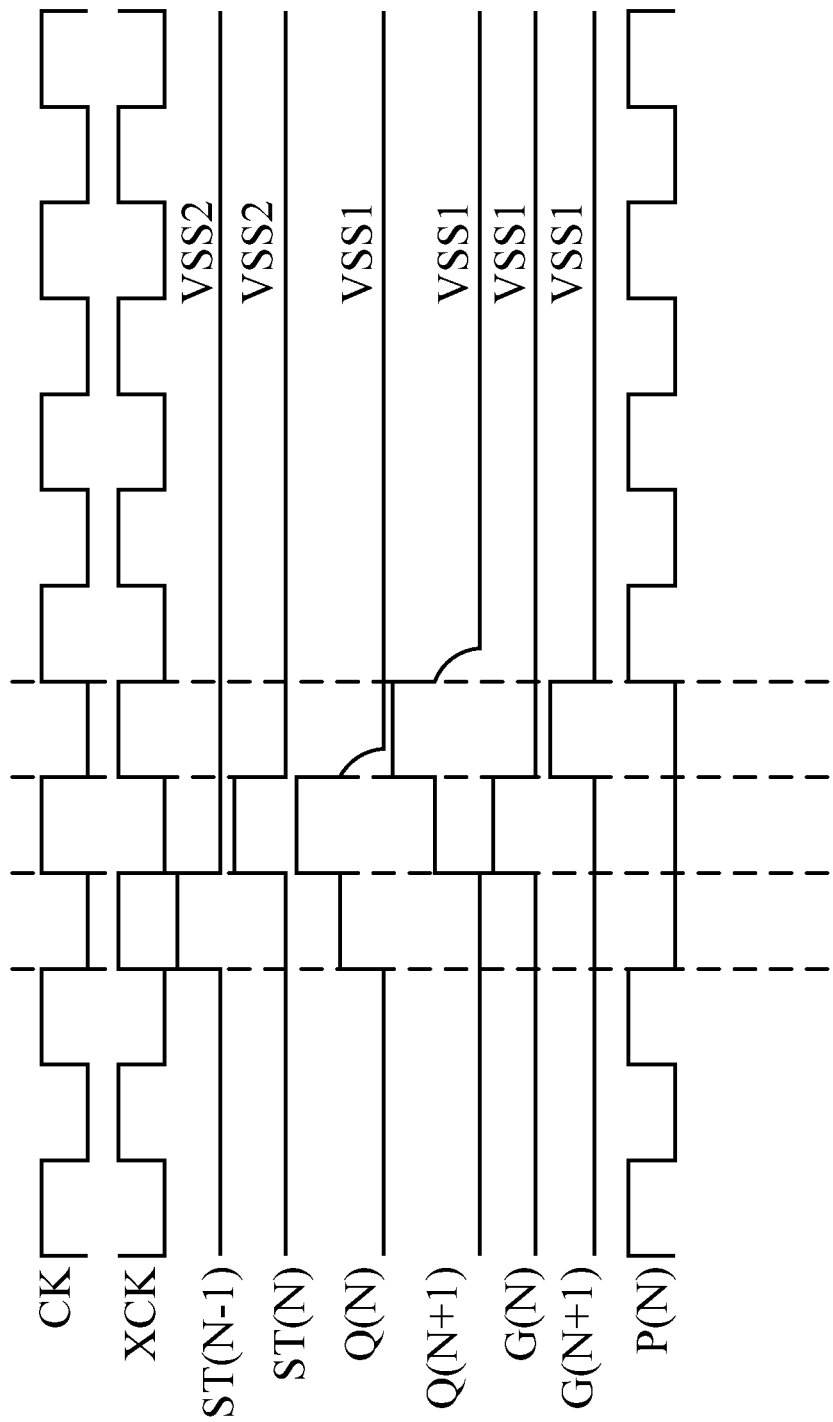
FIG. 8B is timing diagram of input signals, output signals, and voltages applied on nodes illustrated in FIG. 8A.

Please refer to FIG. 8A and FIG. 8B. FIG. 8A is a circuit diagram of the shift register unit shown in FIG. 2 according to a sixth embodiment of the present invention. FIG. 8B is timing diagram of input signals, output signals, and voltages applied on nodes illustrated in FIG. 8A. The elements of the shift register unit SR(N) in FIG. 8A have the same labeled number with those of the shift register unit SR(N) in FIG. 6A have the identical operating principles, and no further description is demonstrated. A difference between FIG. 8A and FIG. 6A is that the pull-down circuit 400 in FIG. 8A does not comprises a fifteenth transistor T15 to decrease for shortening RC delay. The operation principle and achieving effect of the shift register unit SR(N) in FIG. 8A is identical to which of the shift register unit SR(N) in FIG. 6A, there is no further description accordingly.

Figure 9A:
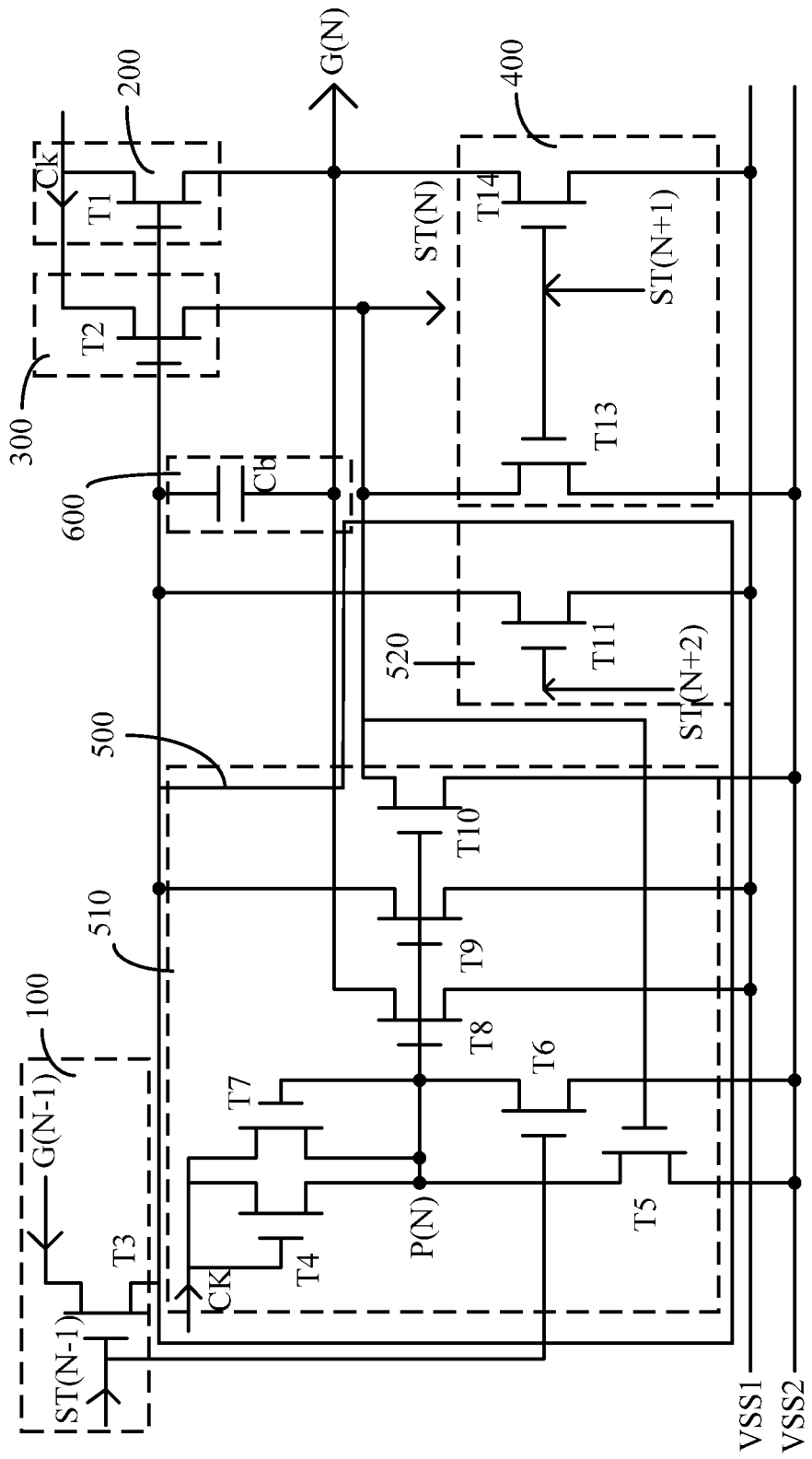
FIG. 9A is a circuit diagram of the shift register unit shown in FIG. 2 according to a seventh embodiment of the present invention.
Figure 9B:
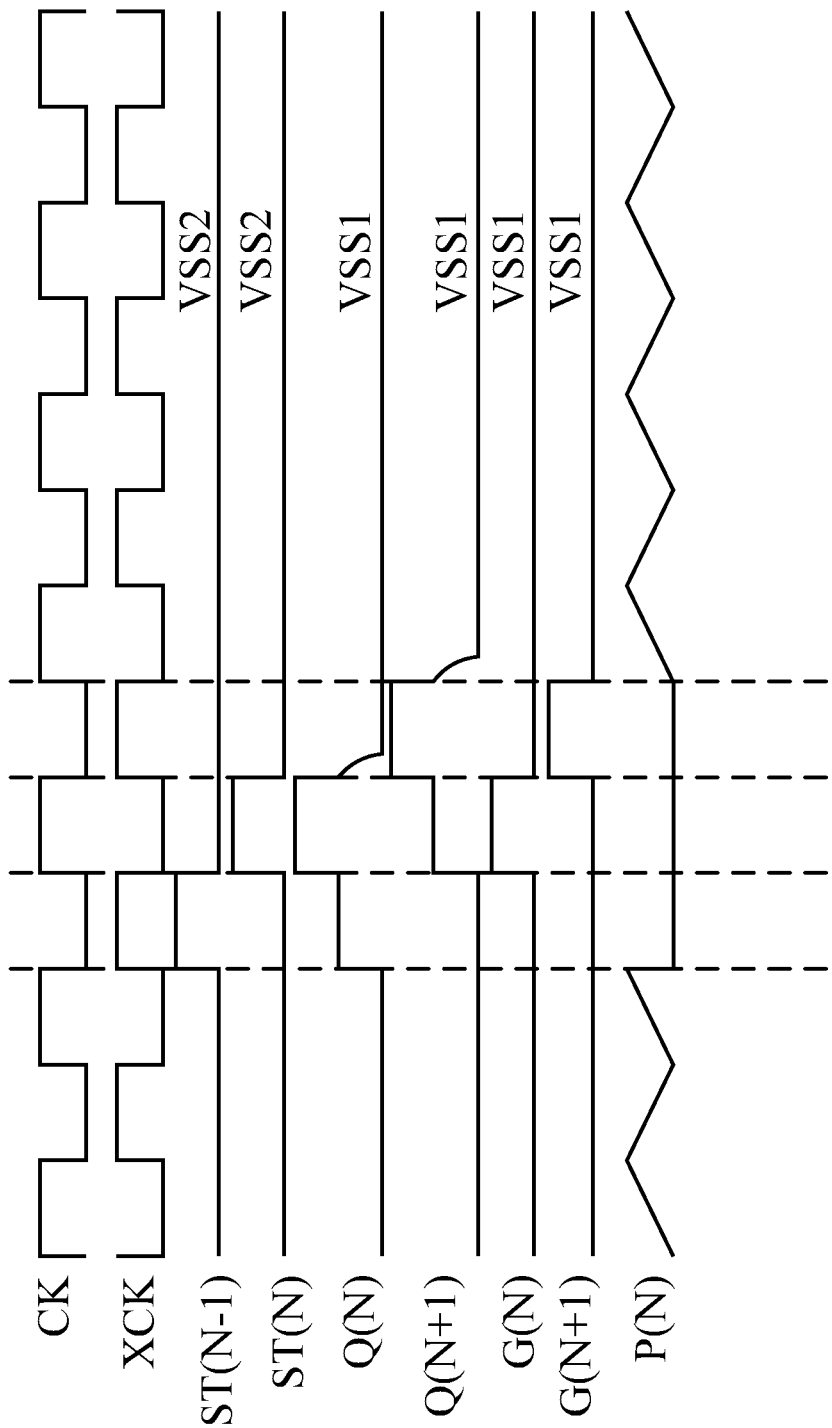
FIG. 9B is timing diagram of input signals, output signals, and voltages applied on nodes illustrated in FIG. 9A.

Please refer to FIG. 9A and FIG. 9B. FIG. 9A is a circuit diagram of the shift register unit shown in FIG. 2 according to a seventh embodiment of the present invention. FIG. 9B is timing diagram of input signals, output signals, and voltages applied on nodes illustrated in FIG. 9A. The elements of the shift register unit SR(N) in FIG. 9A have the same labeled number with those of the shift register unit SR(N) in FIG. 8A have the identical operating principles, and no further description is demonstrated. A difference between FIG. 9A and FIG. 8A is that the gate of the seventh transistor T7 of the first pull-down holding circuit 510 is coupled to the second node P(N) so that it reduces cross line crosstalk between the first clock signal CK and the second clock signal XCK. Compared with FIG. 8B, the second node P(N) discharges more effectively according to waveform of the seventh transistor T7. The operation principle and achieving effect of the shift register unit SR(N) in FIG. 9A is identical to which of the shift register unit SR(N) in FIG. 8A, there is no further description accordingly.

Figure 10A:
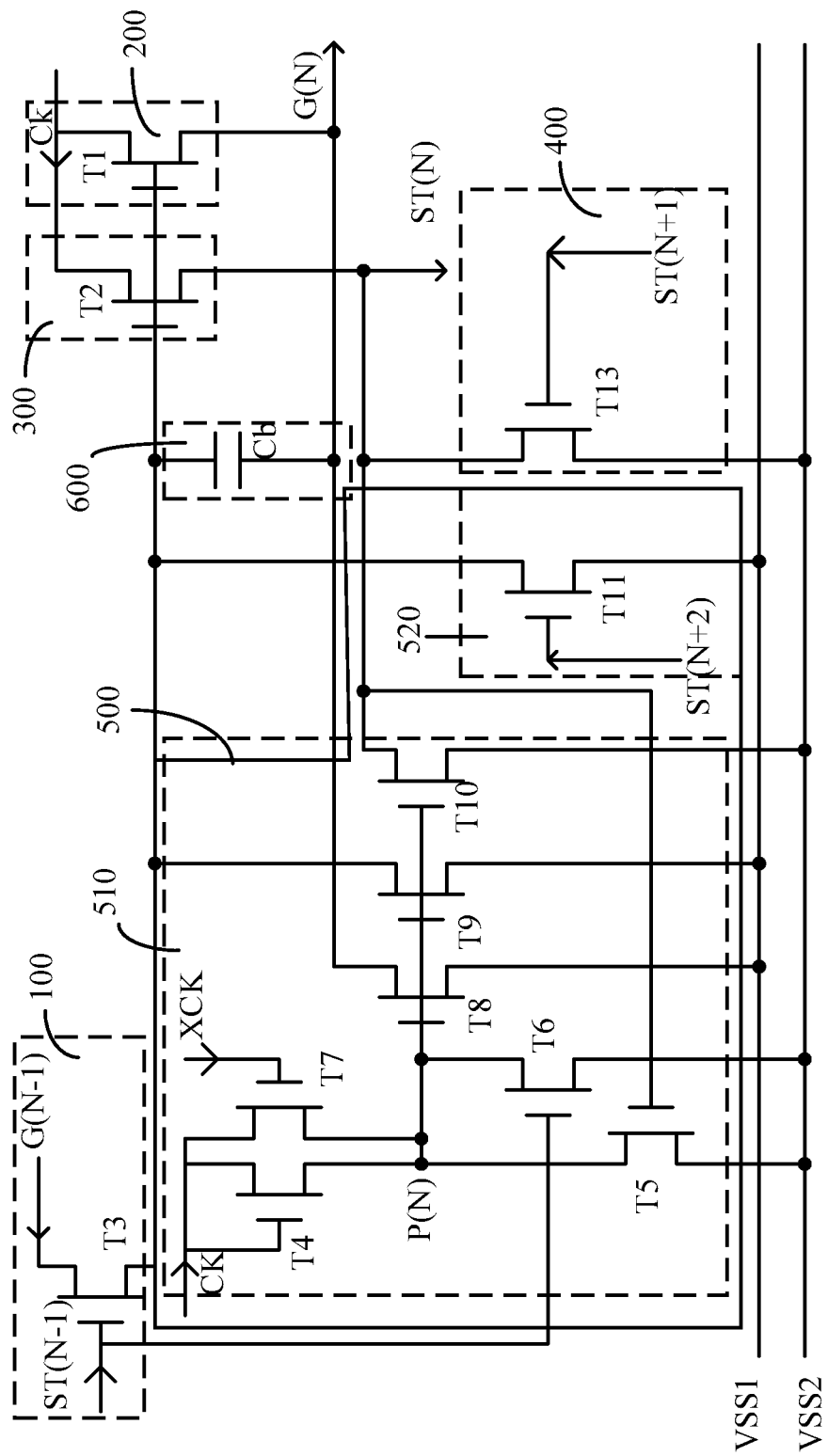
FIG. 10A is a circuit diagram of the shift register unit shown in FIG. 2 according to an eighth first embodiment of the present invention.
Figure 10B:
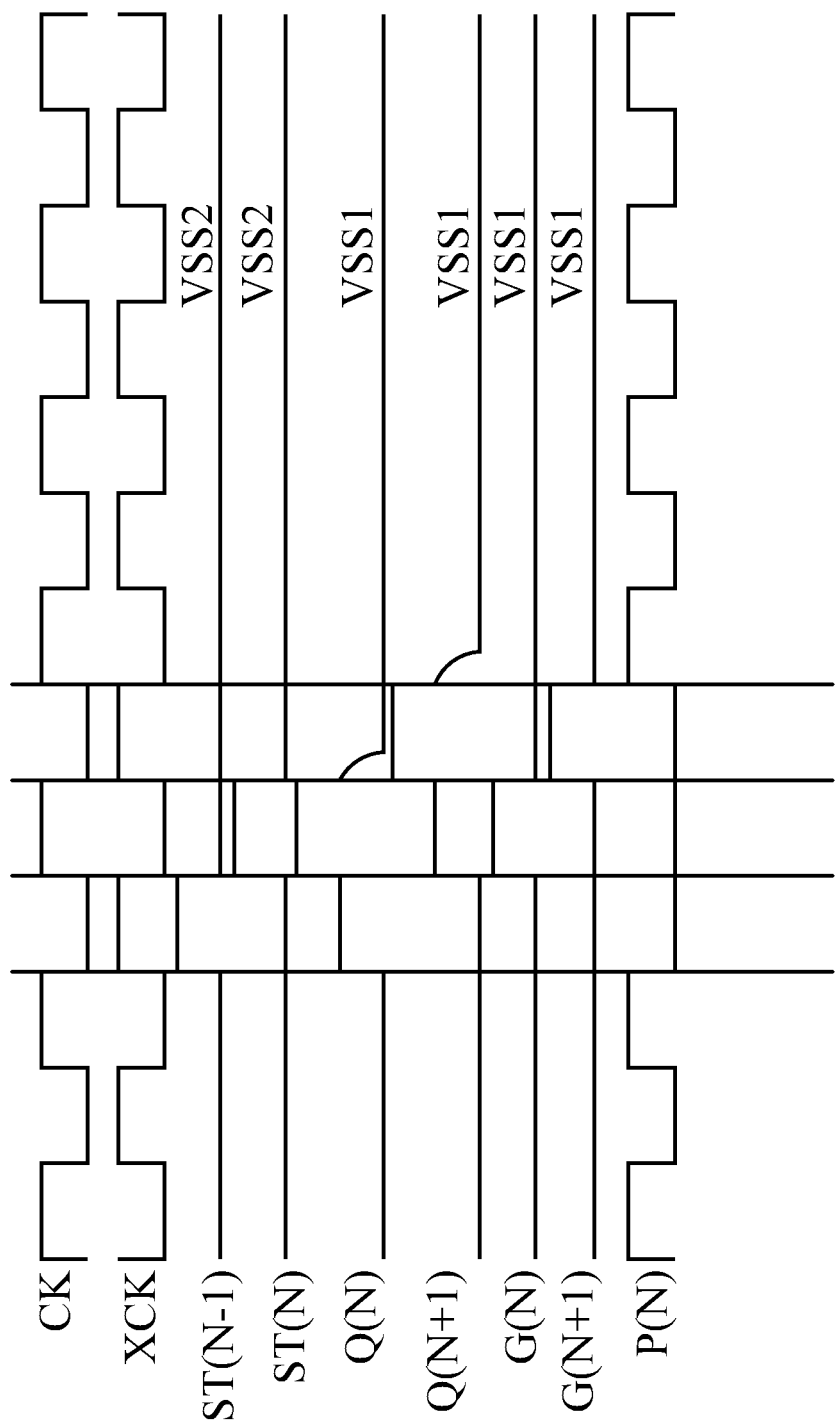
FIG. 10B is timing diagram of input signals, output signals, and voltages applied on nodes illustrated in FIG. 10A.

Refer to FIG. 10A and FIG. 10B. FIG. 10A is a circuit diagram of the shift register unit shown in FIG. 2 according to an eighth embodiment of the present invention. FIG. 10B is timing diagram of input signals, output signals, and voltages applied on nodes illustrated in FIG. 10A. The elements of the shift register unit SR(N) in FIG. 10A have the same labeled number with those of the shift register unit SR(N) in FIG. 8A have the identical operating principles, and no further description is demonstrated. A difference between FIG. 10A and FIG. 8A is that the pull-down circuit 400 in FIG. 10A does not comprises a fourteenth transistor T14 to decrease for shortening RC delay. The operation principle and achieving effect of the shift register unit SR(N) in FIG. 10A is identical to which of the shift register unit SR(N) in FIG. 8A, there is no further description accordingly.

Figure 11A:
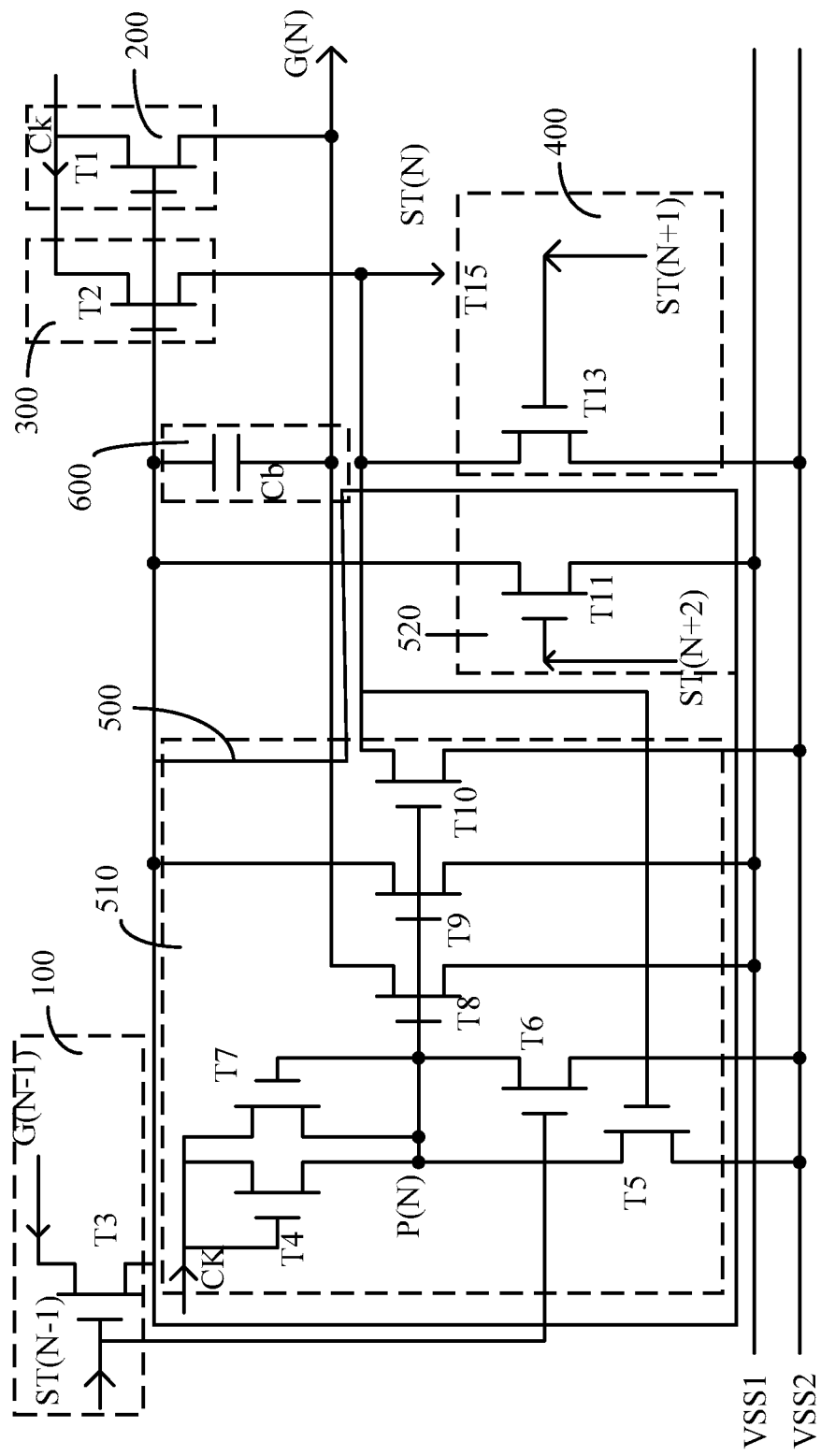
FIG. 11A is a circuit diagram of the shift register unit shown in FIG. 2 according to a ninth embodiment of the present invention.
Figure 11B:
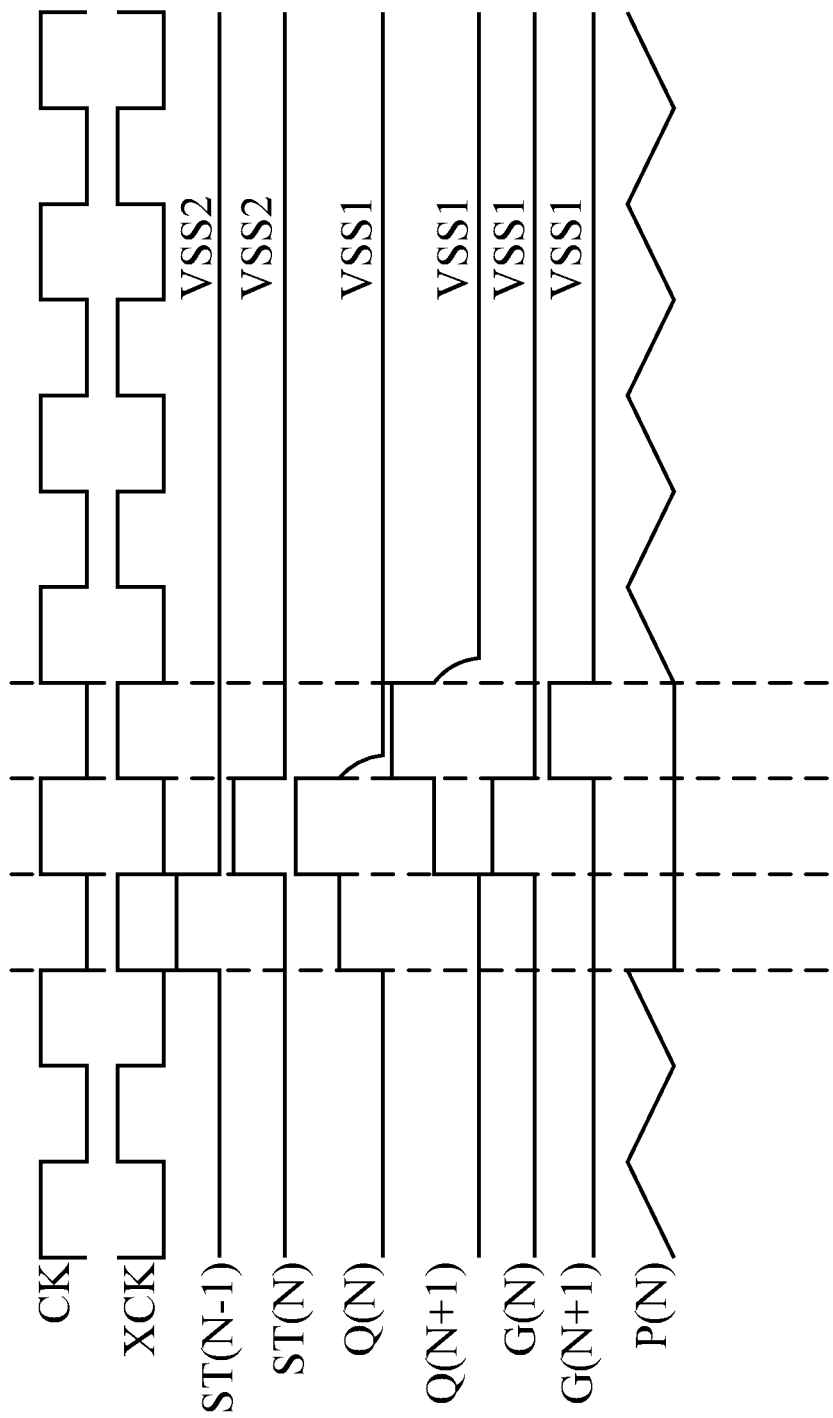
FIG. 11B is timing diagram of input signals, output signals, and voltages applied on nodes illustrated in FIG. 11A.

Please refer to FIG. 11A and FIG. 11B. FIG. 11A is a circuit diagram of the shift register unit shown in FIG. 2 according to a ninth embodiment of the present invention. FIG. 11B is timing diagram of input signals, output signals, and voltages applied on nodes illustrated in FIG. 11A. The elements of the shift register unit SR(N) in FIG. 11A have the same labeled number with those of the shift register unit SR(N) in FIG. 10A have the identical operating principles, and no further description is demonstrated. A difference between FIG. 11A and FIG. 10A is that the gate of the seventh transistor T7 of the first pull-down holding circuit 510 is coupled to the second node P(N) so that it reduces cross line crosstalk between the first clock signal CK and the second clock signal XCK. Compared with FIG. 10B, the second node P(N) discharges more effectively according to waveform of the seventh transistor T7. The operation principle and achieving effect of the shift register unit SR(N) in FIG. 11A is identical to which of the shift register unit SR(N) in FIG. 10A, there is no further description accordingly.

In contrast to the prior art, the gate driver in the present invention simplifies a circuit structure by effectively compounding the pull-down holding circuit and signals to achieve a design for ultra-narrow bezel gate driver. In addition, It effectively lessens voltage offset at the second node and prolongs GOA circuit operating time to prolongs lifetime of the LCD when the seventh transistor of the first pull-down holding circuit adopts equivalent diode connection. At last, it reduces RC delay to efficiently lower power-consumption to more effectively decrease LCD energy-consumption when amount of transistors and signals of the first and the second pull-down holding circuits decreases.

The present invention has been described with reference to certain preferred and alternative embodiments which are intended to be exemplary only and not limited to the full scope of the present invention as set forth in the appended claims.

What is claimed is:

1. A gate driver comprising:
a plurality of cascaded connected shift register units, each shift register unit for outputting output signal pulses at an output end of each of the shift register units according to a first clock signal, a second clock signal inversed to the first clock signal, and a driving signal pulse from a previous one shift register unit of each of the shift register units, each shift register unit comprising:
a pull-up circuit, comprising a first transistor whose a gate coupled to a first node, a source coupled to a first clock signal and a drain coupled to the output end, for providing the output signal pulses from the output end according to the first clock signal;
a transfer circuit, comprising a second transistor whose a gate coupled to the first node, a source coupled to a first clock signal, and a drain coupled to a driving signal end, for outputting the driving signal pulse from the driving signal end according to the first clock signal;
a pull-up control circuit, comprising a third transistor whose a source coupled to an output signal end of the previous one shift register unit, a gate coupled to a driving signal end of the previous one shift register end, a drain coupled to the first node, for conducting the pull-up circuit according to the driving signal pulses of the previous one shift register unit;
a boost circuit, coupled between the first node and the output end, for boosting potentials of the first node;
a first pull-down holding circuit, coupled to the first node, the first clock signal, a first constant voltage and a second constant voltage, for maintaining the first node at low voltage level;
a second pull-down holding circuit, coupled to the first node, a driving signal end of the shift register unit after the next shift register unit, and the first constant voltage, for pulling down potentials of the first node according to driving signals of the shift register unit after the next shift register unit; and
a pull-down circuit, coupled to the first constant voltage, the driving signal end and a driving signal end of a next one shift register unit, for pulling-down the potential of the first node to the first constant voltage,
wherein the first pull-down holding circuit comprises:
a fourth transistor whose a gate and a source coupled to the first clock signal and a drain coupled to a second node;
a fifth transistor whose a gate coupled to the driving signal end, a source coupled to the second node and a drain coupled to the second constant voltage;
a sixth transistor whose a gate coupled to the driving signal end of the previous one shift register unit, a source coupled to the second node and a drain coupled to the second constant voltage;
a seventh transistor whose a gate coupled to the second clock signal or the second node, a source coupled to the first clock signal and a drain coupled to the second node;
an eighth transistor whose a gate coupled to the second node, a source coupled to the output end and a drain coupled to the first constant voltage;
a ninth transistor whose a gate coupled to the second node, a source coupled to the first node and a drain coupled to the first constant voltage; and
a tenth transistor whose a gate coupled to the second node, a source coupled to the driving signal end and a drain coupled to the second constant voltage,
wherein a magnitude of the first constant voltage is greater than that of the second constant voltage.

2. The gate driver of claim 1, wherein the second pull-down holding circuit comprises:
an eleventh transistor whose a gate coupled to the driving signal end of the shift register unit after the next shift register unit, a source coupled to the first node and a drain coupled to the first constant voltage.

3. The gate driver of claim 2, wherein the second pull-down holding circuit further comprises:
a twelfth transistor whose a gate coupled to the driving signal end of the shift register unit after the next shift register unit, a source coupled to the output end and a drain coupled to the first constant voltage.

4. The gate driver of claim 1, wherein the pull-down circuit comprises:
a thirteenth transistor whose a gate coupled to the driving signal end of the next one shift register unit, a source coupled to the driving signal end and a drain coupled to the second constant voltage.

5. The gate driver of claim 4, wherein the pull-down circuit further comprises:
a fourteenth transistor whose a gate coupled to the driving signal end of the next one shift register unit, a source coupled to the output end and a drain coupled to the first constant voltage.

6. The gate driver of claim 5, wherein the pull-down circuit further comprises:
a fifteenth transistor whose a gate coupled to the driving signal end of the next one shift register unit, a source coupled to the first node and a drain coupled to the first constant voltage.

7. The gate driver of claim 5, wherein the pull-down circuit further comprises:

a fifteenth transistor whose a gate coupled to the driving signal end of the next one shift register unit, a source coupled to the first node; and
a sixteenth transistor whose a gate and a source both coupled to the drain of the fifteenth transistor and a drain coupled to the first constant voltage.

8. The gate driver of claim 1, wherein the boost circuit is a capacitor.

* * * * *